United States Patent
Jung (10) Patent No.: US 9,998,102 B2
(45) Date of Patent: Jun. 12, 2018

(54) PHASE AND FREQUENCY CONTROL CIRCUIT AND SYSTEM INCLUDING THE SAME

(71) Applicant: SK hynix Inc., Icheon-si, Gyeonggi-do (KR)

(72) Inventor: In Hwa Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/152,898

(22) Filed: May 12, 2016

(65) Prior Publication Data
US 2017/0230036 A1 Aug. 10, 2017

(30) Foreign Application Priority Data
Feb. 5, 2016 (KR) .................. 10-2016-0014932

(51) Int. Cl.
*H03K 5/133* (2014.01)
*H03K 5/00* (2006.01)

(52) U.S. Cl.
CPC ......... *H03K 5/133* (2013.01); *H03K 5/00006* (2013.01); *H03K 2005/00234* (2013.01); *H03K 2005/00286* (2013.01)

(58) Field of Classification Search
CPC ..... G06F 1/00; G06F 1/08; G06F 7/00; G06F 7/68; H03K 2005/00; H03K 2005/00234; H03K 2005/00286; H03K 23/00; H03K 23/667; H03K 23/68; H03K 5/00; H03K 5/00006; H03K 5/133
USPC ....................................................... 327/115
See application file for complete search history.

(56) References Cited

U.S. PATENT DOCUMENTS

2006/0132213 A1* 6/2006 Suzuki ............... H03K 5/15066
327/291
2006/0145772 A1* 7/2006 Xiu ....................... H03L 7/0995
331/45

FOREIGN PATENT DOCUMENTS

KR 1020120004697 A 1/2012

* cited by examiner

*Primary Examiner* — Lincoln Donovan
*Assistant Examiner* — David Mattison
(74) *Attorney, Agent, or Firm* — William Park & Associates Ltd.

(57) ABSTRACT

A phase and frequency control circuit may be provided. The phase and frequency control circuit may include a division circuit configured to generate a plurality of divided signals by dividing an input signal. The phase and frequency control circuit may include a timing control circuit configured to generate a plurality of timing control signals by sampling the plurality of divided signals according to a phase control code and a sampling reference signal.

17 Claims, 12 Drawing Sheets

Division Ratio(N)=8, PH=5(PH<0:2>=101)

PHASE AND FREQUENCY CONTROL CIRCUIT AND SYSTEM INCLUDING THE SAME

CROSS-REFERENCES TO RELATED APPLICATION

The present application claims priority under 35 U.S.C. § 119(a) to Korean application number 10-2016-0014932, filed on Feb. 5, 2016, in the Korean Intellectual Property Office, which is incorporated herein by reference in its entirety.

BACKGROUND

1. Technical Field

Various embodiments generally relate to a semiconductor circuit, and more particularly, to a phase and frequency control circuit.

2. Related Art

With regards to semiconductor circuit technology, a clock signal is used as a reference signal for adjusting operation timings in a system or circuit.

In particular, a system or circuit which operates in a wide frequency range needs to stably control the phase and frequency of a clock signal within a desired range.

SUMMARY

In an embodiment, a phase and frequency control circuit may be provided. The phase and frequency control circuit may include a division circuit configured to generate a plurality of divided signals by dividing an input signal. The phase frequency control circuit may include a timing control circuit configured to generate a plurality of timing control signals by sampling the plurality of divided signals according to a phase control code and a sampling reference signal.

In an embodiment, a phase and frequency control circuit may be provided. The phase and frequency control circuit may include an input selection circuit configured to generate an output signal using differential signals according to a phase control code. The phase and frequency control circuit may include a division circuit configured to generate a plurality of divided signals by dividing one of the differential signals. The phase and frequency control circuit may include a timing control circuit configured to generate a plurality of timing control signals by sampling the plurality of divided signals according to the phase control code and a sampling reference signal.

In an embodiment, a phase and frequency control circuit may be provided. The phase and frequency control circuit may include an input selection circuit configured to generate an output signal by selectively combining differential signals according to partial bits of a phase control code. The phase frequency control circuit may include a division circuit configured to generate a plurality of divided signals by dividing one of the differential signals. The phase frequency control circuit may include a timing control circuit configured to generate a plurality of timing control signals by sampling the plurality of divided signals according to the other bits of the phase control code and an output signal of the input selection circuit.

DETAILED DESCRIPTION

Various embodiments may be directed to a phase and frequency control circuit capable of stably controlling the frequency and phase of a clock signal.

Hereinafter, a phase and frequency control circuit according to the present disclosure will be described below with reference to the accompanying drawings through examples of embodiments.

Figure 1:
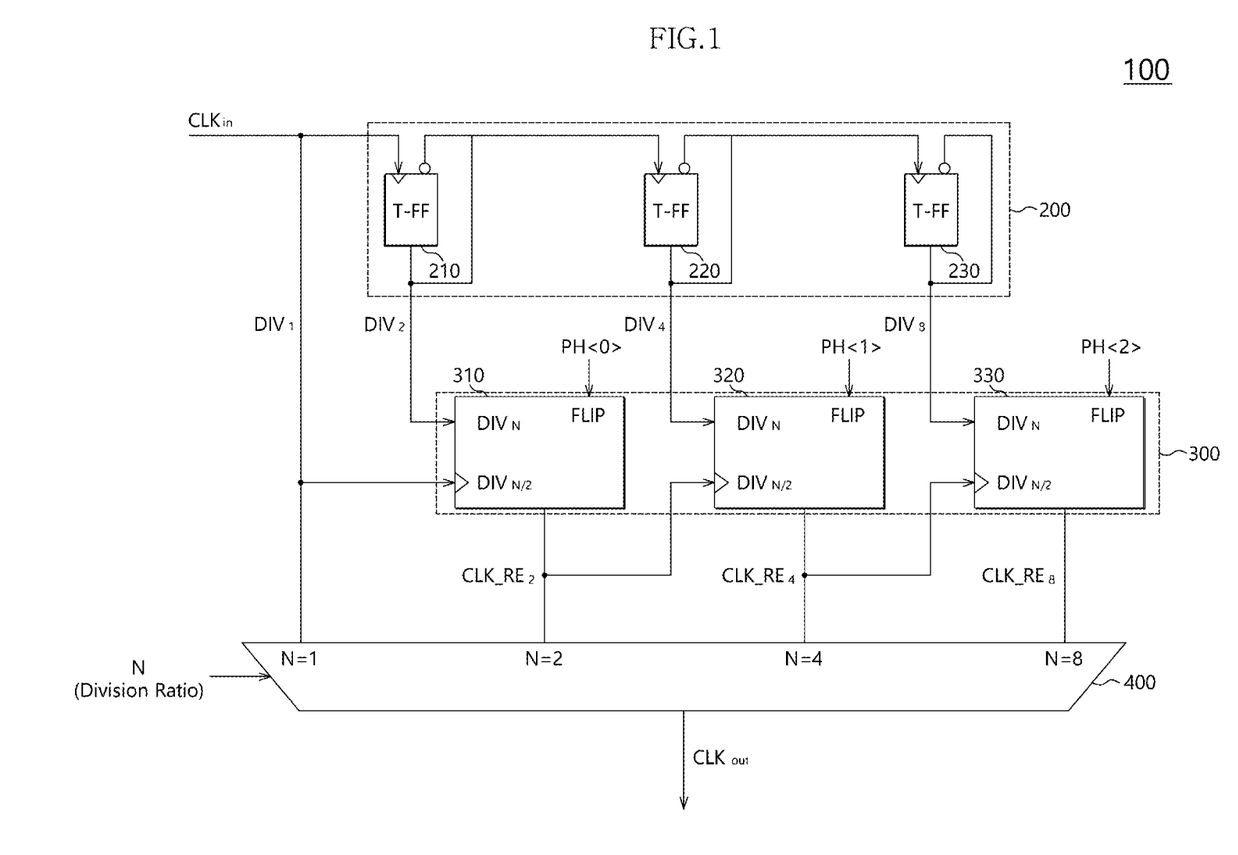
FIG. 1 is a diagram illustrating a representation of an example of the configuration of a phase and frequency control circuit 100 according to an embodiment.

Referring to FIG. 1, a phase and frequency control circuit 100 according to an embodiment may generate a phase and frequency control signal CLKout with a desired phase and frequency according to a single-phase input signal.

The phase and frequency control circuit 100 according to an embodiment may include a division circuit 200, a timing control circuit 300, and a multiplexing circuit 400.

The division circuit 200 may divide an input signal or an output signal of a previous divider, and generate a plurality of divided signals, that is, first to third divided signals DIV2, DIV4, and DIV8.

A clock signal CLKin may be used as the input signal, and a part of the first to third divided signals DIV2, DIV4, and DIV8 or the divided signals DIV2 and DIV4 may be used as the output signal of the previous divider.

The division circuit 200 may include first to third dividers 210 to 230.

Each of the first to third dividers 210 to 230 may include a flip-flop T-FF.

The first divider 210 may generate the first divided signal DIV2 by dividing the clock signal CLKin by a predetermined division ratio (for example, 2).

When the division ratio is '2', the first divided signal DIV2 may have a frequency corresponding to a half of the clock signal CLKin.

The flip-flop T-FF may latch a feedback signal or a signal obtained by inverting the first divided signal DIV2 which is an output thereof, and output the latched signal according to the clock signal CLKin which is an input signal, when performing a division operation.

The second divider 220 may generate the second divided signal DIV4 by dividing the first divided signal DIV2 by 2.

The third divider 230 may generate the third divided signal DIV8 by dividing the second divided signal DIV4 by 2.

The timing control circuit 300 may sample the first to third division signals DIV2, DIV4 and DIV8 according to a phase control code PH<0:2> and a sampling reference signal, and generate a plurality of timing control signals or first to third timing control signals CLK_RE2, CLK_RE4 and CLK_RE8.

The clock signal CLKin or an output signal of a previous timing controller may be used as the sampling reference signal.

The output signal of the previous timing controller may include a part of the first to third timing control signals CLK_RE2, CLK_RE4 and CLK_RE8, that is, the first and second timing controls CLK_RE2 and CLK_RE4.

The timing control circuit 300 may include first to third timing controllers 310 to 330.

The first timing controller 310 may receive the first divided signal DIV2 through a first input terminal DIVn, receive the corresponding bit PH<0> of the phase control code PH<0:2> through a second input terminal FLIP, and receive the clock signal CLKin as the sampling reference signal through a third input terminal DIVn/2.

The first timing controller 310 may generate the first timing control signal CLK_RE2 by sampling the first divided signal DIV2 according to the clock signal CLKin and the corresponding bit PH<0> of the phase control code PH<0:2>.

The second timing controller 320 may receive the second divided signal DIV4 through a first input terminal DIVn, receive the corresponding bit PH<1> of the phase control code PH<0:2> through a second input terminal FLIP, and receive the first timing control signal CLK_RE2 as the sampling reference signal through a third input terminal DIVn/2.

The second timing controller 320 may generate the second timing control signal CLK_RE4 by sampling the second divided signal DIV4 according to the first timing control signal CLK_RE2 and the corresponding bit PH<1> of the phase control code PH<0:2>.

The third timing controller 330 may receive the third divided signal DIV8 through a first input terminal DIVn, receive the corresponding bit PH<2> of the phase control code PH<0:2> through a second input terminal FLIP, and receive the second timing control signal CLK_RE4 as the sampling reference signal through a third input terminal DIVn/2.

The third timing controller 330 may generate the third timing control signal CLK_RE8 by sampling the third divided signal DIV8 according to the second timing control signal CLK_RE4 and the corresponding bit PH<2> of the phase control code PH<0:2>.

The multiplexing circuit 400 may select one signal among the clock signal CLKin and the first to third timing control signals CLK_RE2, CLK_RE4 and CLK_RE8 according to the value of the division ratio N (i.e., N=1, N=2, N=4, N=8, etc.), and output the selected signal as the phase and frequency control signal CLKout.

Figure 2:
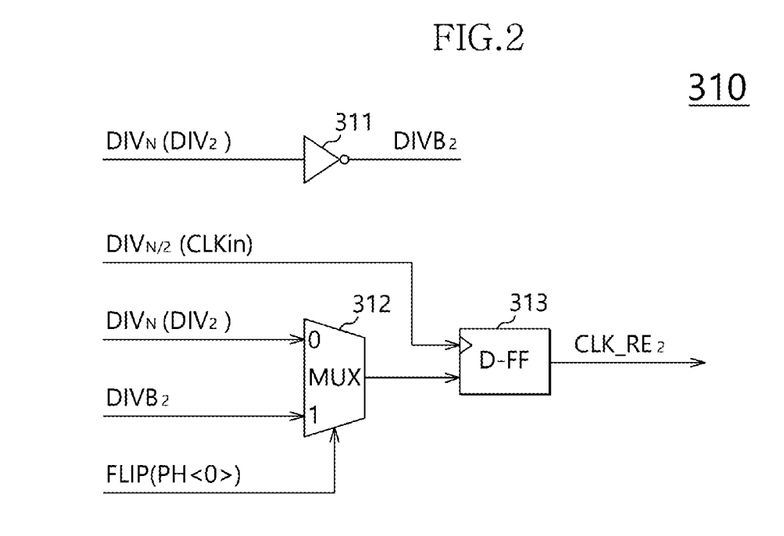
FIG. 2 is a diagram illustrating a representation of an example of the configuration of a timing controller 310 of FIG. 1.

Referring to FIG. 2, the first timing controller 310 may include an inverter 311, a multiplexer 312, and a flip-flop (D-FF) 313.

The inverter 311 may invert the first divided signal DIV2, and output the inverted first divided signal DIVB2.

The multiplexer 312 may selectively output the first divided signal DIV2 or the inverted first divided signal DIVB2 according to the corresponding bit PH<0> of the phase control code PH<0:2>, which is inputted through the control terminal FLIP.

The flip-flop 313 may output a signal obtained by latching the output signal of the multiplexer 312 as the first timing control signal CLK_RE2 according to DIV1, that is, the clock signal CLKin.

The first to third timing controllers 310 to 330 may be configured in substantially the same manner except input and output signals thereof. Accordingly, descriptions of the second timing controller 320 and the third timing controller 330 will be omitted hereinafter to avoid duplicate explanation.

Figure 3A:
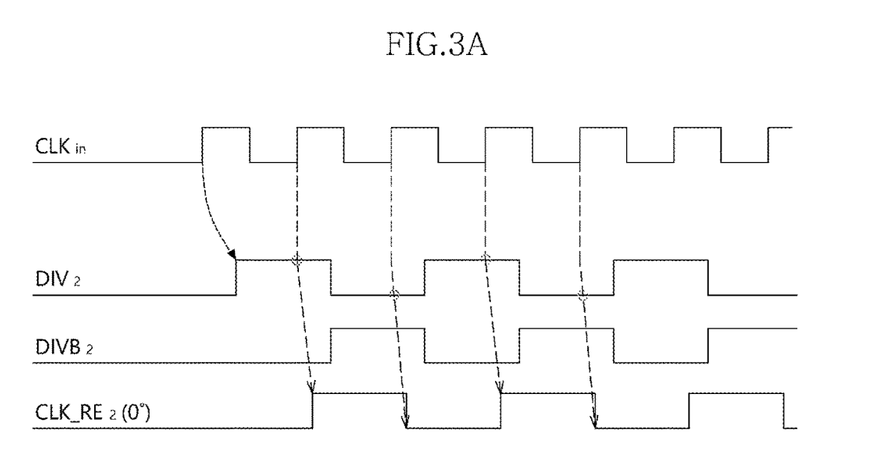
FIGS. 3A and 3B are examples of operation timing diagrams of the timing controller 310 of FIG. 1.
Figure 3B:
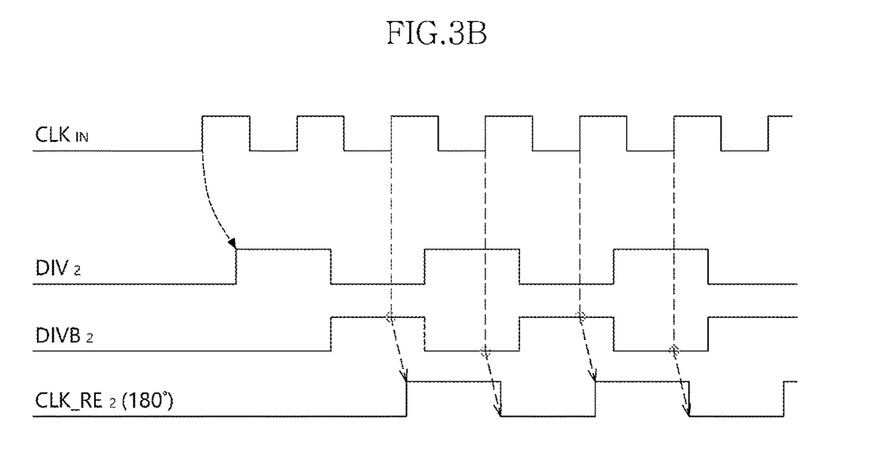

Referring to FIGS. 3A and 3B, the operation of the first timing controller 310 will be described as follows.

As illustrated in FIG. 3A, when the corresponding bit PH<0> of the phase control code PH<0:2> has a logic low value, the first timing controller 310 may sample the first divided signal DIV2 according to the clock signal CLKin, and output the sampled signal as the first timing control signal CLK_RE2.

On the other hand, when the corresponding bit PH<0> of the phase control code PH<0:2> has a logic high value as illustrated in FIG. 3B, the first timing controller 310 may sample the inverted first divided signal DIVB2 according to the clock signal CLKin, and output the sampled signal as the first timing control signal CLK_RE2.

At this time, since the first timing control signal CLK_RE2 of FIG. 3B is generated by sampling the inverted first divided signal DIVB2 according to the clock signal CLKin, the first timing control signal CLK_RE2 of FIG. 3B may have a phase difference of 180° from the first timing control signal CLK_RE2 of FIG. 3A.

Figure 4A:
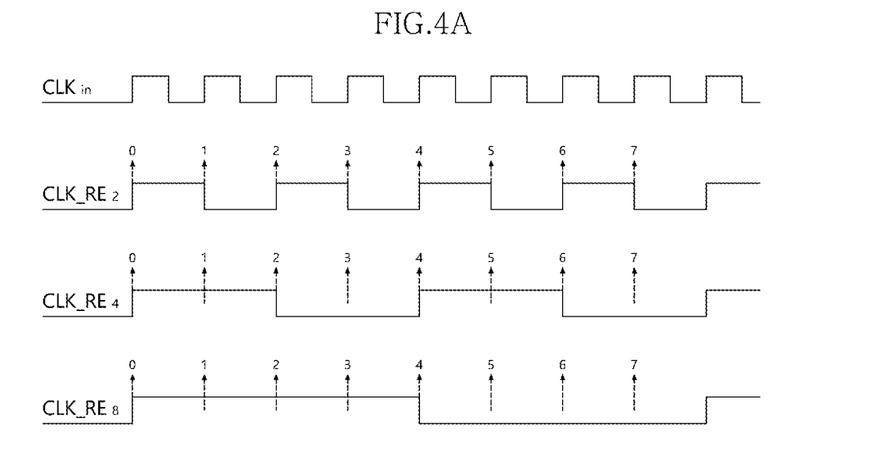
FIGS. 4A and 4B are examples of operation timing diagrams of the phase and frequency control circuit 100 according to an embodiment.

As illustrated in FIG. 4A, the final output signal of the phase and frequency control circuit 100 according to the present embodiment, that is, the phase and frequency control signal CLKout may have various phases which are proportional to the number of input phases and the division ratio N.

At this time, since FIG. 4A illustrates an example in which the number of input phases is '1' (CLKin) and the maximum value of the division ratio N is 8, the phase and frequency control signal CLKout may have eight phases.

Referring to FIG. 4A, the numbers 0 to 7 marked at the top of each waveform may indicate the decimal values of the phase control code PH<0:2> for selecting the eight phases of the phase and frequency control signal CLKout, respectively.

Figure 4B:
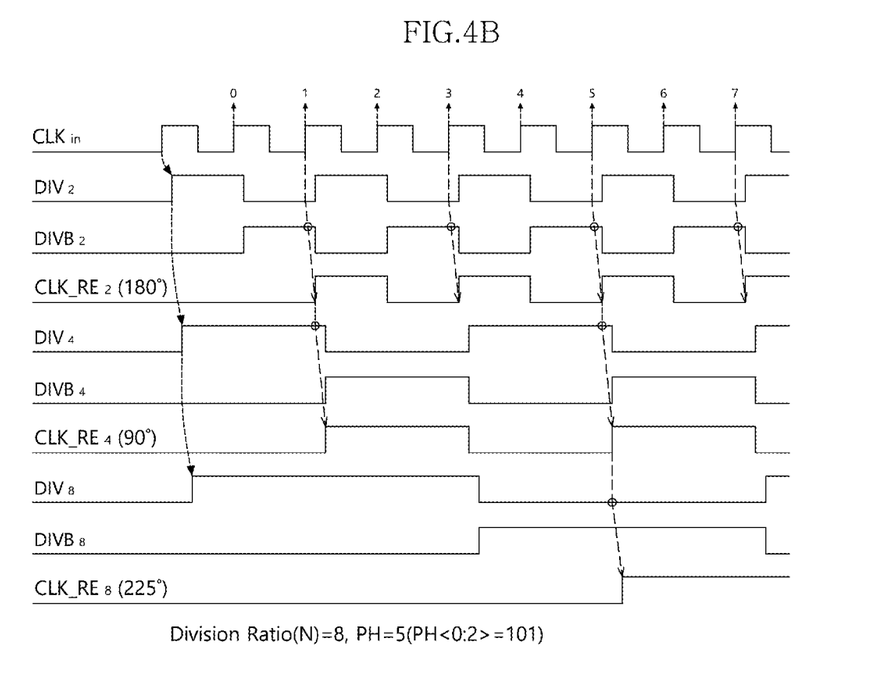

Referring to FIG. 4B, the operation of generating the phase and frequency control signal CLKout with a desired phase and frequency will be described.

The division ratio N may be set to 1, 2, 4 or 8. When the division ratio N is 1 (N=1), the clock signal CLKin may be selected and outputted as the phase and frequency control signal CLKout. When the division ratio N is 2 (N=2), the first timing control signal CLK_RE2 having a frequency corresponding to a half of the frequency of the clock signal CLKin may be selected and outputted as the phase and frequency control signal CLKout. When the division ratio N is 4 (N=4), the third timing control signal CLK_RE8 having a frequency corresponding to a half of the frequency of the second timing control signal CLK_RE4 may be selected and outputted as the phase and frequency control signal CLKout.

The phase and frequency control signal CLKout may be set to a desired phase according to a combination of the division ratio N and the decimal value of the phase control code PH<0:2>.

For example, an operation of generating the third timing control signal CLK_RE8 having a phase of 225° as the phase and frequency control signal CLKout will be described.

The third timing control signal CLK_RE8 is a signal obtained by dividing an input signal or the clock signal CLKin by 8.

One cycle of the clock signal CLKin may correspond to ⅛ (45°) of one cycle of the third timing control signal CLK_RE8.

Thus, the division ratio N may be set to '8', and the decimal value of the phase control code PH<0:2> may be set to '5' corresponding to five cycles of the clock signal CLKin.

When the phase control code PH<0:2> is '5' (decimal value), the binary value of the phase control code PH<0:2> may be set to 101.

Since PH<0>=1, the phase and frequency control circuit 100 may generate the first timing control signal CLK_RE2 by sampling the inverted first divided signal DIVB2 according to the clock signal CLKin.

Since PH<1>=0, the phase and frequency control circuit 100 may generate the second timing control signal CLK_RE4 by sampling the second divided signal DIV4 according to the first timing control signal CLK_RE2.

Since PH<2>=1, the phase and frequency control circuit 100 may generate the third timing control signal CLK_RE8 by sampling the inverted third divided signal DIVB8 according to the second timing control signal CLK_RE4.

Since the division ratio N is '8', the third timing control signal CLK_RE8 having a phase of 225° may be outputted as the phase and frequency control signal CLKout.

Figure 5:
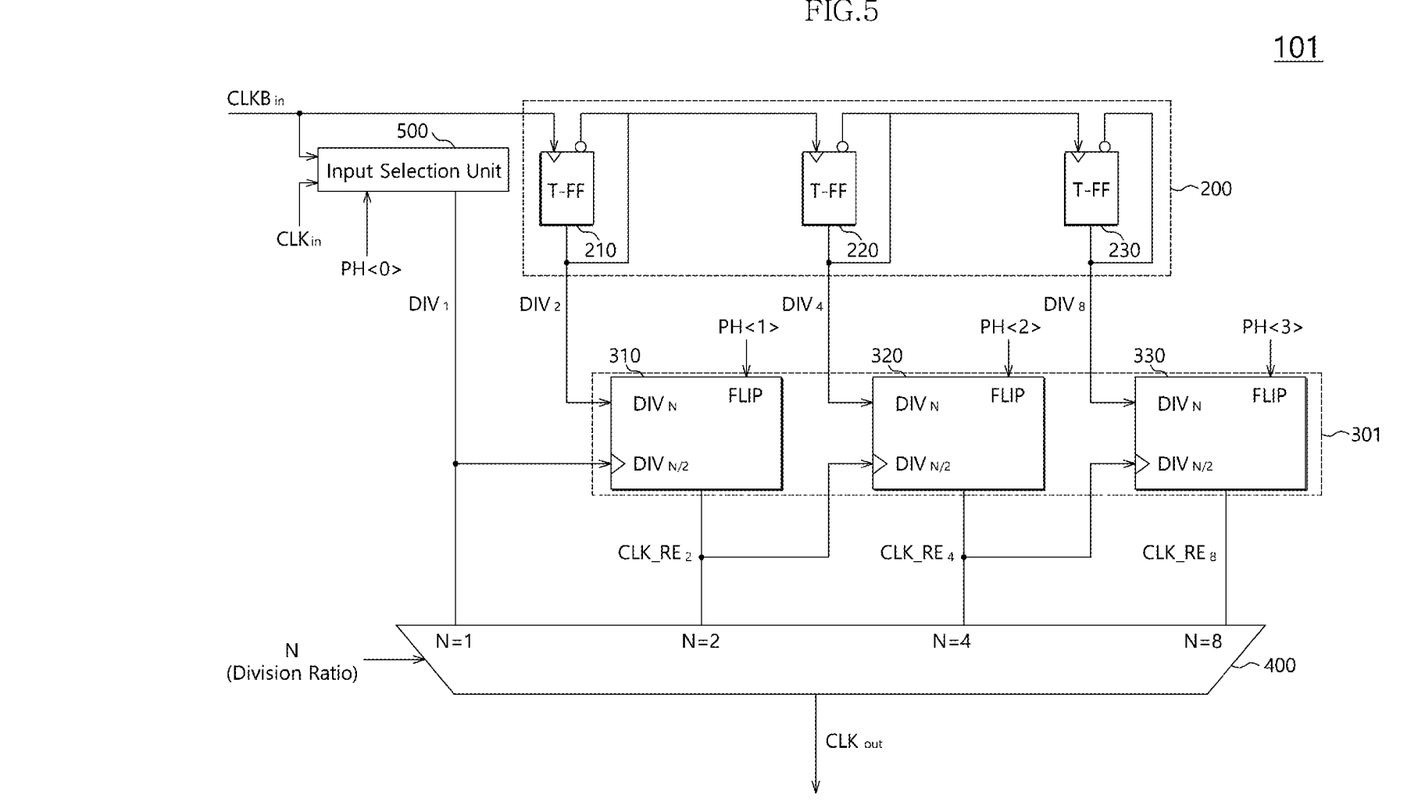
FIG. 5 is a diagram illustrating a representation of an example of the configuration of a phase and frequency control circuit 101 according to an embodiment.

Referring to FIG. 5, a phase and frequency control circuit 101 according to an embodiment may generate a phase and frequency control signal CLKout with a desired phase and frequency according to differential input signals.

The phase and frequency control circuit 101 according to the present embodiment may include a division circuit 200, a timing control circuit 300, a multiplexing circuit 400 and an input selection circuit 500.

The input selection circuit 500 may select one of differential signals or a clock signal CLKin and an inverted clock signal CLKBin according to a phase control code PH<0>, and generate an output signal DIV1.

The output signal DIV1 of the input selection circuit 500 may be provided as a sampling reference signal to the timing control circuit 300.

The division circuit 200 may divide an input signal or an output signal of a previous divider, and generate a plurality of divided signals, that is, first to third divided signals DIV2, DIV4, and DIV8.

The inverted clock signal CLKBin may be used as the input signal, and a part of the first to third divided signals DIV2, DIV4 and DIV8, that is, the divided signals DIV2 and DIV4 may be used as the output signal of the previous divider.

The timing control circuit 300 may sample the first to third divided signals DIV2, DIV4 and DIV8 according to phase control codes PH<1:3> and the sampling reference signal, and generate the plurality of timing control signals or first to third timing control signals CLK_RE2, CLK_RE4 and CLK_RE8.

The output signal DIV1 of the input selection circuit 500 or an output signal of a previous timing controller may be used as the sampling reference signal.

The output signal of the previous timing controller may include a part of the first to third timing control signals CLK_RE2, CLK_RE4 and CLK_RE8, that is, the first and second timing controls CLK_RE2 and CLK_RE4.

The multiplexing circuit 400 may select one signal among the output signal DIV1 of the input selection circuit 500 and the first to third timing control signals CLK_RE2, CLK_RE4 and CLK_RE8 according to the value of the division ratio N (i.e., N=1, N=2, N=4, N=8, etc.), and output the selected signal as the phase and frequency control signal CLKout.

The division circuit 200, the timing control circuit 300 and the multiplexing circuit 400 may be configured in substantially the same manner as FIG. 1 except input and output signals thereof. Accordingly, descriptions of the division circuit 200, the timing control circuit 300 and the multiplexing circuit 400 will be omitted hereinafter to avoid duplicate explanation.

Figure 6:
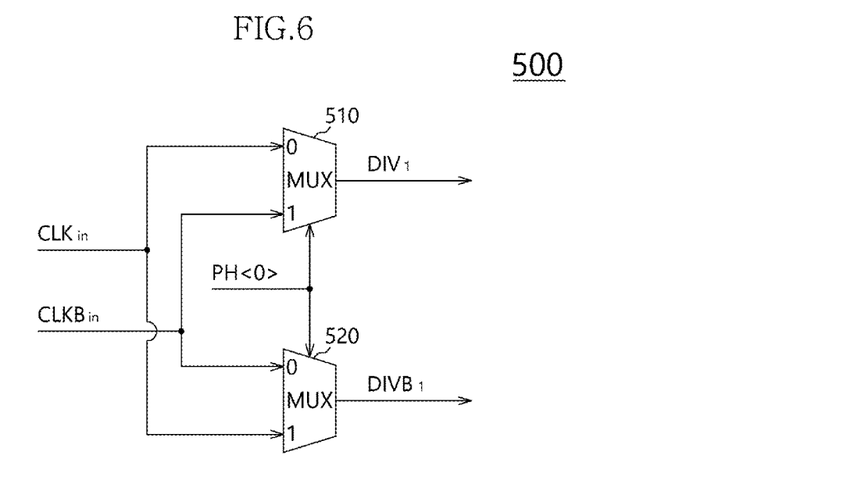
FIG. 6 is a diagram illustrating a representation of an example of the configuration of an input selection circuit 500 of FIG. 5.

Referring to FIG. 6, the input selection circuit 500 of FIG. 5 may include a first multiplexer 510 and a second multiplexer 520.

The first multiplexer 510 may generate the output signal DIV1 by selecting the clock signal CLKin or the inverted clock signal CLKBin according to the phase control code PH<0>.

The second multiplexer 520 may generate the output signal DIVB1 by selecting the inverted clock signal CLKBin or the clock signal CLKin according to the phase control code PH<0>.

In an embodiment of FIG. 5, the case in which the input selection circuit 500 uses the output signal DIV1 between the output signal DIV1 of the first multiplexer 510 and the output signal DIVB1 of the second multiplexer 520 was taken as an example.

Figure 7:
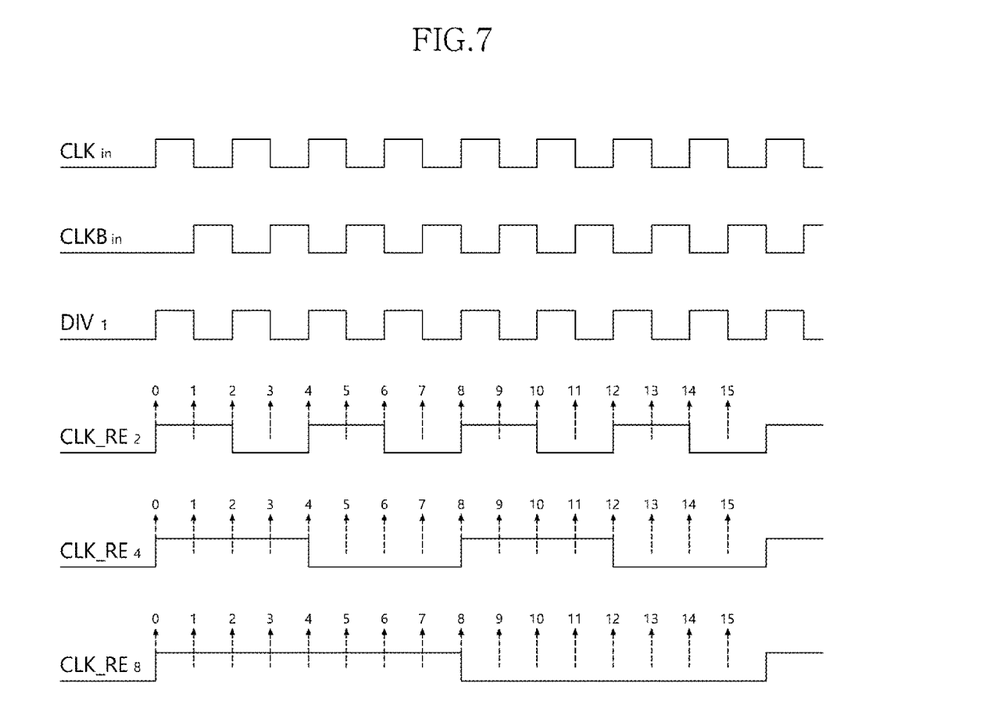
FIG. 7 is an operation timing diagram example of the phase and frequency control circuit 101 according to an embodiment.

Referring to FIG. 7, the final output signal of the phase and frequency control circuit 101 according to an embodiment, that is, the phase and frequency control signal CLKout may have various phases which are proportional to the number of input phases and the division ratio N.

Since FIG. 7 illustrates an example in which the number of input phases is '2' (CLKin and CLKBin) and the maximum value of the division ratio N is 8, the phase and frequency control signal CLKout may have 16 phases.

The numbers 0 to 15 marked at the top of each waveform may indicate the decimal values of the phase control code PH<0:3> for selecting the 16 phases of the phase and frequency control signal CLKout, respectively.

The phase and frequency control circuit 101 according to an embodiment may generate the phase and frequency control signal CLKout with a desired frequency and phase in substantially the same manner as FIG. 4B, and the detailed descriptions of the operation are omitted herein.

Figure 8:
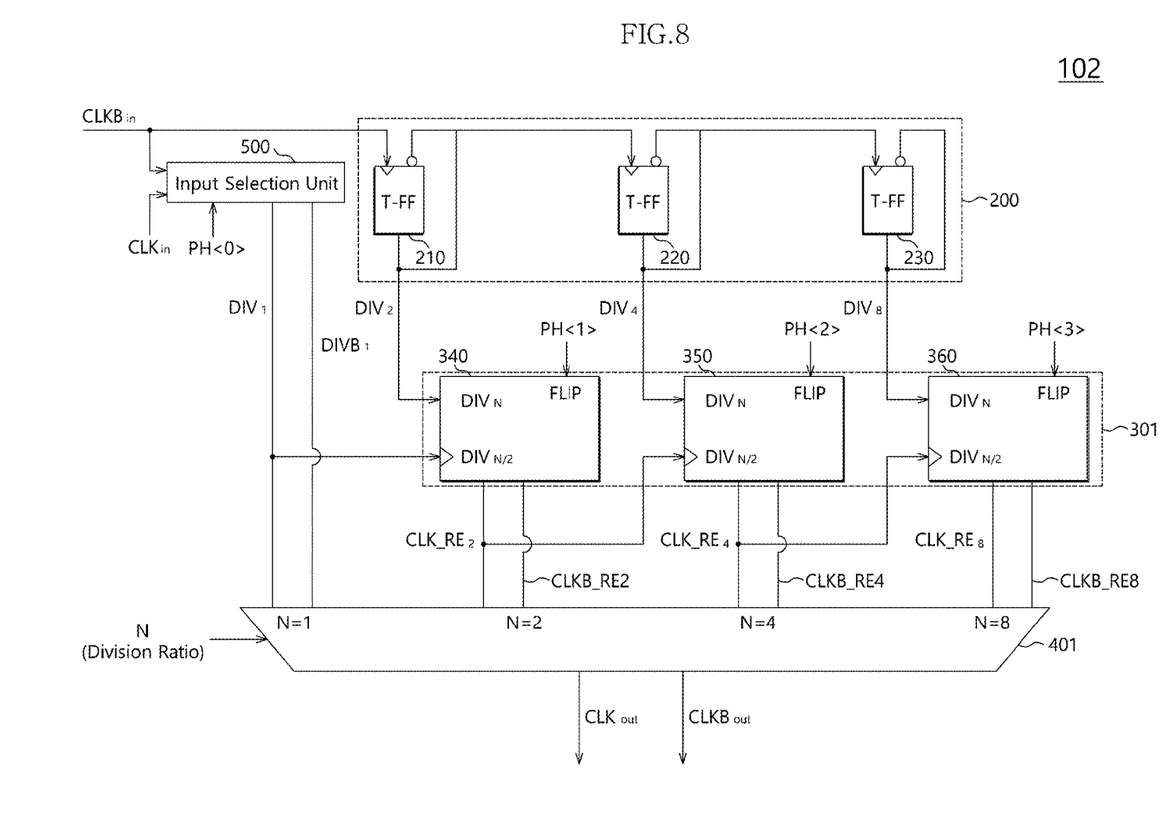
FIG. 8 is a diagram illustrating a representation of an example of the configuration of a phase and frequency control circuit 102 according to an embodiment.

Referring to FIG. 8, a phase and frequency control circuit 102 according to an embodiment may generate a differential phase and frequency control signal set CLKout/CLKBout with a desired phase and frequency according to differential input signals.

The phase and frequency control circuit 102 according to an embodiment may include a division circuit 200, a timing control circuit 301, a multiplexing circuit 401 and an input selection circuit 500.

The input selection circuit 500 may select a clock signal CLKin or an inverted clock signal CLKBin according to a phase control code PH<0>, and output the selected signal as a differential output signal set DIV1 and DIVB1.

One signal of the differential output signal set DIV1 and DIVB1 of the input selection circuit 500, for example, the output signal DIV1 may be provided as a sampling reference signal to the timing control circuit 301.

The input selection circuit 500 may be configured in substantially the same manner as illustrated in FIG. 6. FIG. 8 illustrates an example in which both of the output signal DIV1 of the first multiplexer 510 and the output signal DIVB1 of the second multiplexer 520 are used.

The division circuit 200 may divide an input signal or an output signal of a previous divider, and generate a plurality of divided signals, that is, first to third divided signals DIV2, DIV4, and DIV8.

The inverted clock signal CLKBin may be used as the input signal, and a part of the first to third divided signals DIV2, DIV4 and DIV8, that is, the divided signals DIV2 and DIV4 may be used as the output signal of the previous divider.

The division circuit 200 may be configured in substantially the same manner as FIG. 1.

The timing control circuit 301 may sample the first to third divided signals DIV2, DIV4 and DIV8 according to the phase control codes PH<1:3> and the sampling reference signal, and generate a plurality of differential timing control signal sets or first to third differential timing control signal sets CLK_RE2/CLKB_RE2, CLK_RE4/CLKB_RE4 and CLK_RE8/CLKB_RE8.

The output signal DIV1 of the input selection circuit 500 or an output signal of a previous timing controller may be used as the sampling reference signal.

The output signal of the previous timing controller may include a part of the first to third differential timing control signal sets CLK_RE2/CLKB_RE2, CLK_RE4/CLKB_RE4 and CLK_RE8/CLKB_RE8, that is, the differential timing control signal sets CLK_RE2/CLKB_RE2 and CLK_RE4/CLKB_RE4.

The multiplexing circuit 401 may select one set among the differential output signal set DIV1/DIVB1 of the input selection circuit 600 and the first to third differential timing control signal sets CLK_RE2/CLKB_RE2, CLK_RE4/CLKB_RE4 and CLK_RE8/CLKB_RE8 according to the value of the division ratio N (i.e., N=1, N=2, N=4, N=8, etc.), and output the selected set as the differential phase and frequency control signal set CLKout/CLKBout.

Figure 9:
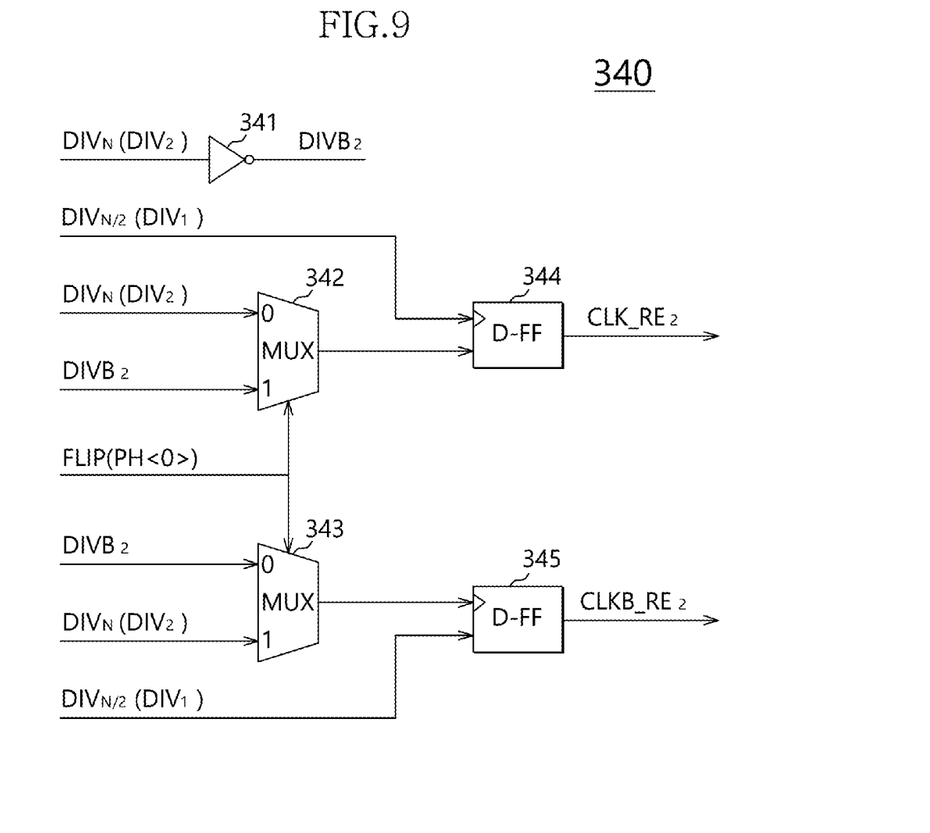
FIG. 9 is a diagram illustrating a representation of an example of the configuration of a timing controller 340 of FIG. 8.

Referring to FIG. 9, the first timing controller 340 may include an inverter 341, a first multiplexer 342, a second multiplexer 343, a first flip-flop (D-FF) 344 and a second flip-flop 345.

The inverter 341 may output the first divided signal DIV2, and output the inverted first divided signal DIVB2.

The first multiplexer 342 may selectively output the first divided signal DIV2 or the inverted first divided signal DIVB2 according to the corresponding bit PH<0> of the phase control code PH<0:2> inputted through the control terminal FLIP.

The second multiplexer 343 may select and output the inverted first divided signal DIVB2 or the first divided signal DIV2 according to the corresponding bit PH<0>.

The first flip-flop 344 may output a signal obtained by latching the output signal of the first multiplexer 342 as one signal of the first differential timing control signal set CLK_RE2/CLKB_RE2, for example, the timing control signal CLK_RE2 according to the output signal DIV1 of the input selection circuit 500.

The second flip-flop 345 may output a signal obtained by latching the output signal of the second multiplexer 343 as the other signal of the first differential timing control signal set CLK_RE2/CLKB_RE2, for example, the timing control signal CLKB_RE2 according to the output signal DIV1 of the input selection circuit 500.

The first to third timing controllers 340 to 360 may be configured in substantially the same manner except input and output signals thereof. Accordingly, descriptions of the second timing controller 350 and the third timing controller 360 will be omitted hereinafter to avoid duplicate explanation.

The phase and frequency control circuit 102 according to an embodiment may generate the differential phase and frequency control signal set CLKout/CLKBout with a desired frequency and phase in substantially the same manner as FIG. 4B, and the detailed descriptions of the operation are omitted herein.

Figure 10:
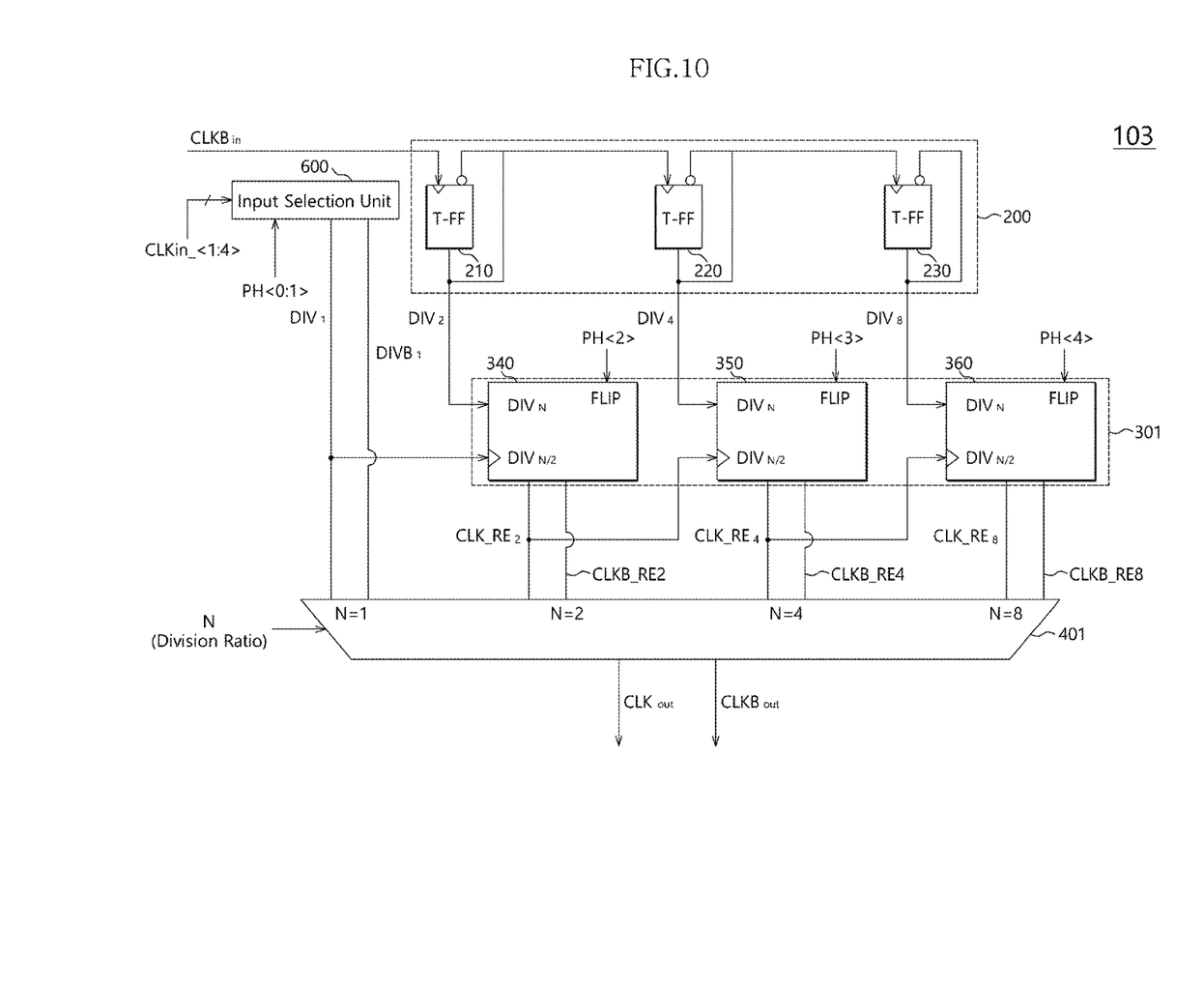
FIG. 10 is a diagram illustrating a representation of an example of the configuration of a phase and frequency control circuit 103 according to an embodiment.

Referring to FIG. 10, a phase and frequency control circuit 103 according to an embodiment may generate a differential phase and frequency control signal set CLKout/CLKBout with a desired phase and frequency according to a multi-phase input signal.

The phase and frequency control circuit 103 according to an embodiment may include a division circuit 200, a timing control circuit 301, a multiplexing circuit 401 and an input selection circuit 600.

The input selection circuit 600 may selectively combine multi-phase clock signals or first to fourth phase clock signals CLKin_<1:4> according to phase control codes PH<0:1>, and generate differential output signals DIV1 and DIVB1 by selecting one of the combinations.

The first to fourth phase clock signals CLKin_<1:4> may have a phase difference of 90° from each other.

For example, when the phase of the first phase clock signal CLKin_1 is 0°, the phases of the second to fourth phase clock signals CLKin_<2:4> may be set to 90°, 180° and 270°, respectively.

One of the differential output signals DIV1 and DIVB1 of the input selection circuit 600, for example, the output signal DIV1 may be provided as a sampling reference signal to the timing control circuit 301.

The division circuit 200 may divide an input signal or an output signal of a previous divider, and generate a plurality of divided signals, that is, first to third divided signals DIV2, DIV4 and DIV8.

The inverted clock signal CLKBin may be used as the input signal, and a part of the first to third divided signals DIV2, DIV4 and DIV8, that is, the divided signals DIV2 and DIV4 may be used as the output signal of the previous divider.

The division circuit 200 may be configured in substantially the same manner as FIG. 1.

The timing control circuit 301 may sample the first to third divided signals DIV2, DIV4 and DIV8 according to phase control codes PH<2:4> and the sampling reference signal, and generate the plurality of differential timing control signal sets or first to third differential timing control signal sets CLK_RE2/CLKB_RE2, CLK_RE4/CLKB_RE4 and CLK_RE8/CLKB_RE8.

The output signal DIV1 of the input selection circuit 600 or an output signal of a previous timing controller may be used as the sampling reference signal.

The output signal of the previous timing controller may include a part of the first to third differential timing control signal sets CLK_RE2/CLKB_RE2, CLK_RE4/CLKB_RE4 and CLK_RE8/CLKB_RE8, that is, the differential timing control signal sets CLK_RE2/CLKB_RE2 and CLK_RE4/CLKB_RE4.

The timing control circuit 301 may include first to third timing controllers 340 to 360, and the first to third timing controllers 340 to 360 may be configured in substantially the same manner as illustrated in FIG. 9 except input and output signals thereof. Accordingly, descriptions of the first to third timing controllers 340 to 360 will be omitted hereinafter to avoid duplicate explanation.

The multiplexing circuit 401 may select one set among the differential output signal set DIV1/DIVB1 of the input selection circuit 600 and the first to third differential timing control signal sets CLK_RE2/CLKB_RE2, CLK_RE4/CLKB_RE4 and CLK_RE8/CLKB_RE8 according to the value of the division ratio N (i.e., N=1, N=2, N=4, N=8, etc.), and output the selected set as the differential phase and frequency control signal set CLKout/CLKBout.

Figure 11:
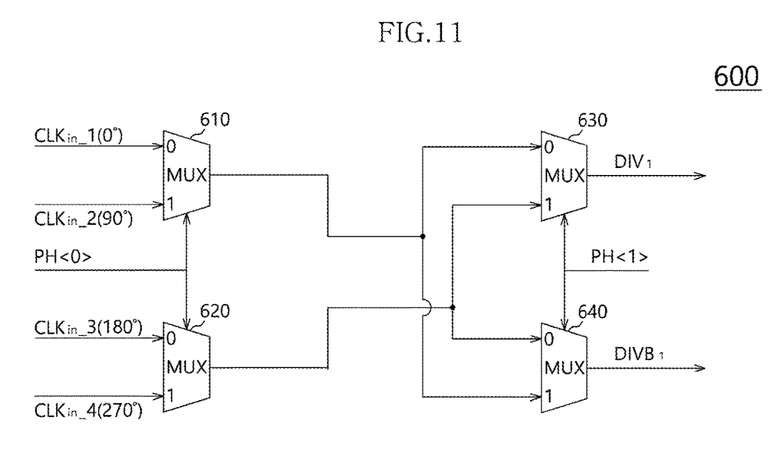
FIG. 11 is a diagram illustrating a representation of an example of the configuration of an input selection circuit 600 of FIG. 10.

Referring to FIG. 11, the input selection circuit 600 of FIG. 10 may include first to fourth multiplexers 610 to 640.

The first multiplexer 610 may select and output one of the first and second phase clock signals CLKin_1 and CLKin_2 according to the phase control code PH<0>.

The second multiplexer 620 may select and output one of the third and fourth phase clock signals CLKin_3 and CLKin_4 according to the phase control code PH<0>.

The third multiplexer 630 may select one signal between the output signal of the first multiplexer 610 and the output signal of the second multiplexer 620 according to the phase control code PH<1>, and output the selected signal as one signal of the differential output signal set DIV1 and DIVB1 (for example, DIV1).

The fourth multiplexer 640 may select one signal between the output signal of the second multiplexer 620 and the output signal of the first multiplexer 610 according to the phase control code PH<1>, and output the selected signal as the other signal of the differential output signal set DIV1 and DIVB1 (for example, DIVB1).

Figure 12:
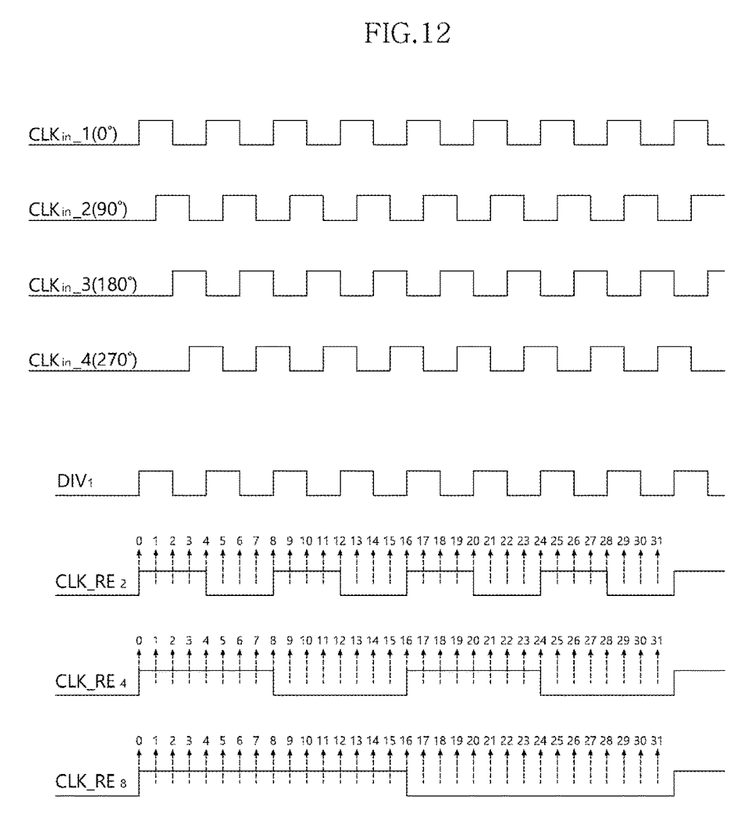
FIG. 12 is an operation timing diagram example of the phase and frequency control circuit 103 according to an embodiment.

Referring to FIG. 12, the final output signal of the phase and frequency control circuit 103 according to an embodiment, that is, the phase and frequency control signal CLKout may have various phases which are proportional to the number of input phases and the division ratio N.

Since FIG. 12 illustrates an example in which the number of input phases is '4' (CLKin_<1:4>) and the maximum value of the division ratio N is 8, the phase and frequency control signal CLKout may have 32 phases.

Referring to FIG. 12, the numbers 0 to 31 marked at the top of each waveform may indicate the decimal values of the phase control code PH<0:4> for selecting the 32 phases of the phase and frequency control signal CLKout, respectively.

The phase and frequency control circuit 103 according to the present embodiment may generate the phase and frequency control signal CLKout with a desired frequency and phase in substantially the same manner as FIG. 4B, and the detailed descriptions of the operation are omitted herein.

In the various embodiments described with reference to FIGS. 1, 5, 8 and 10, the case in which the phase control code PH has 3 to 5 bits has been taken as an example for description. However, more bits may be used. As the bit number of the phase control code is increased, the number of circuits included in the division circuit and the timing control circuit may be increased in proportion to the bit number of the phase control code.

The phase and frequency control circuits as discussed above (see FIGS. 1-12) are particular useful in the design of memory devices, processors, and computer systems. For example, referring to FIG. 13, a block diagram of a system employing a phase and frequency control circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 13:
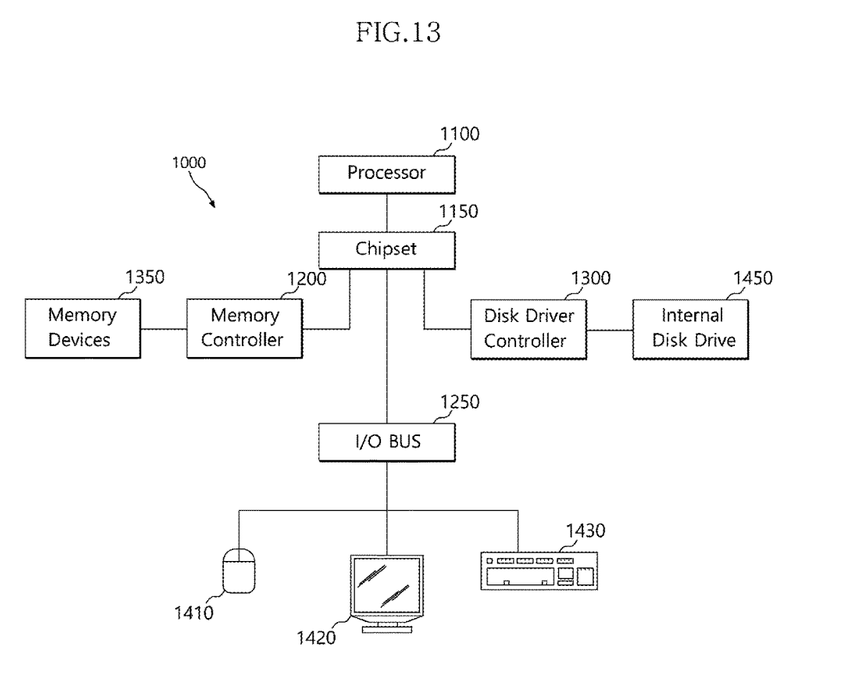
FIG. 13 illustrates a block diagram of an example of a representation of a system employing a phase and frequency control circuit with the various embodiments discussed above with relation to FIGS. 1-12.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one phase and frequency control circuit as discussed above with reference to FIGS. 1-12. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one phase and frequency control circuit as discussed above with relation to FIGS. 1-12, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 13 is merely one example of a system 1000 employing a phase and frequency control circuit as discussed above with relation to FIGS. 1-12. In alternate embodiments, such as, for example but not limited to, cellular phones or digital cameras, the components may differ from the embodiments illustrated in FIG. 13.

While certain embodiments have been described above, it will be understood to those skilled in the art that the embodiments described are by way of example only. Accordingly, the phase and frequency control circuit described herein should not be limited based on the described embodiments. Rather, the phase and frequency control circuit described herein should only be limited in light of the claims that follow when taken in conjunction with the above description and accompanying drawings.

What is claimed is:

1. A phase and frequency control circuit comprising:
    a division circuit configured to generate a plurality of divided signals by dividing an input signal; and
    a timing control circuit configured to generate a plurality of timing control signals by sampling the plurality of divided signals according to a phase control code and a sampling reference signal,
    wherein the sampling reference signal includes the input signal,
    wherein the timing control circuit comprises a plurality of timing controllers, and
    the plurality of timing controllers are configured to generate the plurality of timing control signals by selecting the plurality of divided signals or inverted signals of the plurality of divided signals according to the phase control code, and sampling selected signals according to the sampling reference signal,
    wherein the sampling reference signal includes the input signal or an output of previous timing controller of the plurality of timing controllers.

2. The phase and frequency control circuit according to claim 1, further comprising a multiplexing circuit configured to select one of the timing control signals according to a division ratio, and output the selected signal as a phase and frequency control signal.

3. The phase and frequency control circuit according to claim 2, wherein as the division ratio and the value of the phase control code are controlled, the frequency and phase of the phase and frequency control signal are controlled to target values.

4. The phase and frequency control circuit according to claim 1, wherein the division circuit comprises a plurality of dividers, and
    each of the dividers is configured to latch a signal obtained by inverting an output of a corresponding divider, and output the latched signal according to the input signal or an output signal of the previous divider, when performing a division operation.

5. A phase and frequency control circuit comprising:
    an input selection circuit configured to generate an output signal using differential signals according to a phase control code;
    a division circuit configured to generate a plurality of divided signals by dividing one of the differential signals; and
    a timing control circuit configured to generate a plurality of timing control signals by sampling the plurality of divided signals according to the phase control code and a sampling reference signal,
    wherein the sampling reference signal includes the one of the differential signals.

6. The phase and frequency control circuit according to claim 5, further comprising a multiplexing circuit configured to select one of the timing control signals according to a division ratio, and output the selected signal as a phase and frequency control signal.

7. The phase and frequency control circuit according to claim 6, wherein as the division ratio and the value of the phase control code are controlled, the frequency and phase of the phase and frequency control signal are controlled to target values.

8. The phase and frequency control circuit according to claim 5, wherein the division circuit comprises a plurality of dividers, and
    each of the dividers is configured to latch a signal obtained by inverting an output of a corresponding divider, and output the latched signal according to one of the differential signals or an output signal of the previous divider, when performing a division operation.

9. The phase and frequency control circuit according to claim 5, wherein the timing control circuit comprises a plurality of timing controllers, and
    the plurality of timing controllers are configured to generate the plurality of timing control signals by selecting the plurality of divided signals or inverted signals of the plurality of divided signals according to the phase control code, and sampling selected signals according to the sampling reference signal,
    wherein the sampling reference signal includes the one of the differential signals or an output of previous timing controller of the plurality of timing controllers.

10. The phase and frequency control circuit according to claim 5, wherein the input selection circuit is configured to generate differential output signals using differential signals according to the phase control code.

11. The phase and frequency control circuit according to claim 5, wherein the timing control circuit is configured to generate a plurality of differential timing control signal sets by sampling the plurality of divided signals according to the phase control code and the sampling reference signal.

12. A phase and frequency control circuit comprising:
    an input selection circuit configured to generate an output signal by selectively combining differential signals according to partial bits of a phase control code;
    a division circuit configured to generate a plurality of divided signals by dividing one of the differential signals; and
    a timing control circuit configured to generate a plurality of timing control signals by sampling the plurality of divided signals according to the other bits of the phase control code and the output signal of the input selection circuit.

13. The phase and frequency control circuit according to claim 12, further comprising a multiplexing circuit configured to select one of the timing control signals according to a division ratio, and output the selected signal as a phase and frequency control signal.

14. The phase and frequency control circuit according to claim 13, wherein as the division ratio and the value of the phase control code are controlled, the frequency and phase of the phase and frequency control signal are controlled to target values.

15. The phase and frequency control circuit according to claim 12, wherein the division circuit comprises a plurality of dividers, and each of the dividers is configured to latch a signal obtained by inverting an output of a corresponding divider, and output the latched signal according to one of the differential signals or an output signal of the previous divider, when performing a division operation.

16. The phase and frequency control circuit according to claim 12, wherein the timing control circuit comprises a plurality of timing controllers, and the plurality of timing controllers are configured to generate the plurality of timing control signals by sampling the plurality of divided signals or inverted signals of the plurality of divided signals according to the other bits of the phase control code, respectively, and the output signal of the input selection circuit or an output signal of the previous timing controller.

17. The phase and frequency control circuit according to claim 12, wherein the timing control circuit is configured to output the plurality of timing control signals in the form of differential signals.

* * * * *